(12) United States Patent
Guillet et al.

(10) Patent No.: US 12,007,448 B2
(45) Date of Patent: Jun. 11, 2024

(54) METHOD FOR DETERMINING A PROBE SIGNAL, CHARACTERISATION METHOD USING SUCH A SIGNAL AND DEVICE THEREOF

(71) Applicant: COMMISSARIAT A L'ENERGIE ATOMIQUE ET AUX ENERGIES ALTERNATIVES, Paris (FR)

(72) Inventors: Nicolas Guillet, Grenoble (FR); Sylvain Lespinats, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 128 days.

(21) Appl. No.: 17/783,525

(22) PCT Filed: Dec. 11, 2020

(86) PCT No.: PCT/EP2020/085692
§ 371 (c)(1),
(2) Date: Jun. 8, 2022

(87) PCT Pub. No.: WO2021/122355
PCT Pub. Date: Jun. 24, 2021

(65) Prior Publication Data
US 2023/0017446 A1 Jan. 19, 2023

(30) Foreign Application Priority Data
Dec. 16, 2019 (FR) ..................................... 1914516

(51) Int. Cl.
*G01R 31/382* (2019.01)

(52) U.S. Cl.
CPC ................................ *G01R 31/382* (2019.01)

(58) Field of Classification Search
CPC .................................................... G01R 31/382
See application file for complete search history.

(56) References Cited

U.S. PATENT DOCUMENTS

| 8,984,944 B2 * | 3/2015 | Bernard ........... H01M 10/4285 73/602 |
| 10,132,781 B2 | 11/2018 | Steingart et al. |
| 2013/0091950 A1 | 4/2013 | Bernard |
| 2016/0197382 A1 | 7/2016 | Sood et al. |

(Continued)

FOREIGN PATENT DOCUMENTS

| DE | 10 2015 210266 A1 | 12/2016 |
| FR | 3 080 458 A1 | 10/2019 |
| WO | WO 2018/090678 A1 | 5/2018 |

OTHER PUBLICATIONS

International Search Report as issued in International Patent Application No. PCT/EP2020/085692, dated Apr. 23, 2021.

(Continued)

*Primary Examiner* — Walter L Lindsay, Jr.
*Assistant Examiner* — Milton Gonzalez
(74) *Attorney, Agent, or Firm* — Pillsbury Winthrop Shaw Pittman LLP

(57) ABSTRACT

A method determines a probe signal for acoustically characterising an electrochemical system, the probe signal being determined by an identification signal transmitted in a reference electrochemical system to induce a response from the reference electrochemical system.

15 Claims, 8 Drawing Sheets

(56) References Cited

U.S. PATENT DOCUMENTS

| | | |
|---|---|---|
| 2016/0223498 A1 | 8/2016 | Steingart et al. |
| 2018/0120168 A1 | 3/2018 | Hsieh et al. |
| 2018/0120261 A1 | 3/2018 | Hsieh et al. |
| 2018/0164383 A1* | 6/2018 | Hsieh .................. H01M 10/486 |
| 2019/0072614 A1* | 3/2019 | Steingart ................ G06N 5/046 |
| 2019/0094189 A1* | 3/2019 | Hsieh ................... G01N 29/343 |
| 2021/0175553 A1* | 6/2021 | Van Tassell ........... G01N 29/12 |

OTHER PUBLICATIONS

Gold, L., et al., "Probing lithium-ion batteries' state-of-charge using ultrasonic transmission e Concept and laboratory testing," Journal of Power Sources 343, (2017), pp. 536-544.

\* cited by examiner

[Fig. 1]
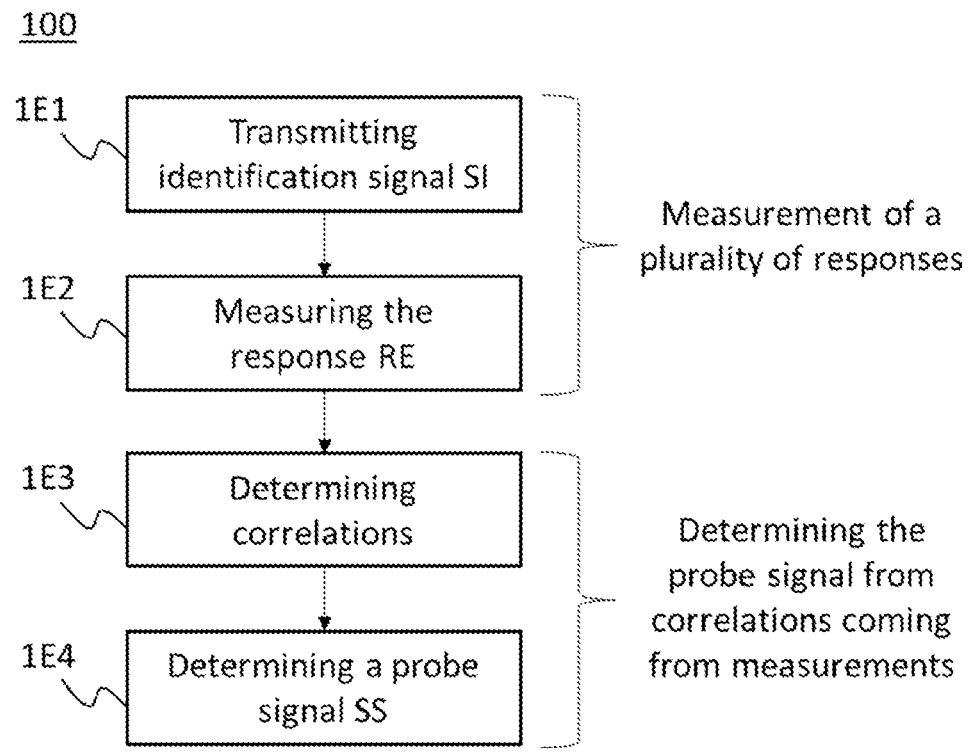
[Fig. 2]
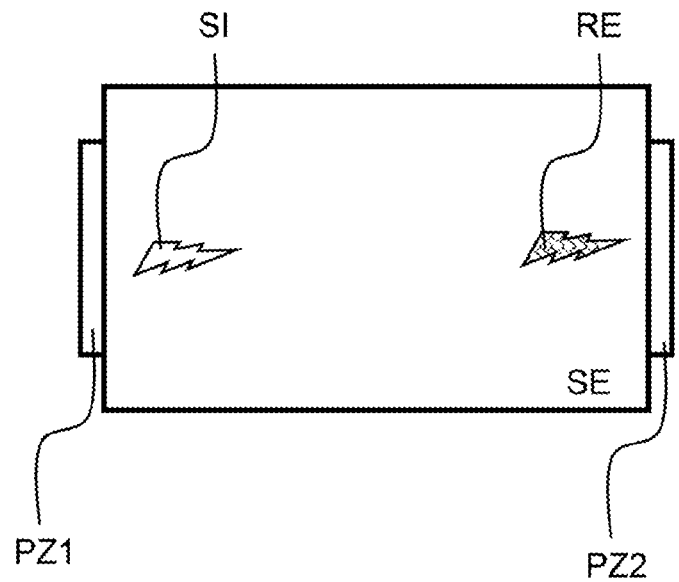

[Fig. 3]
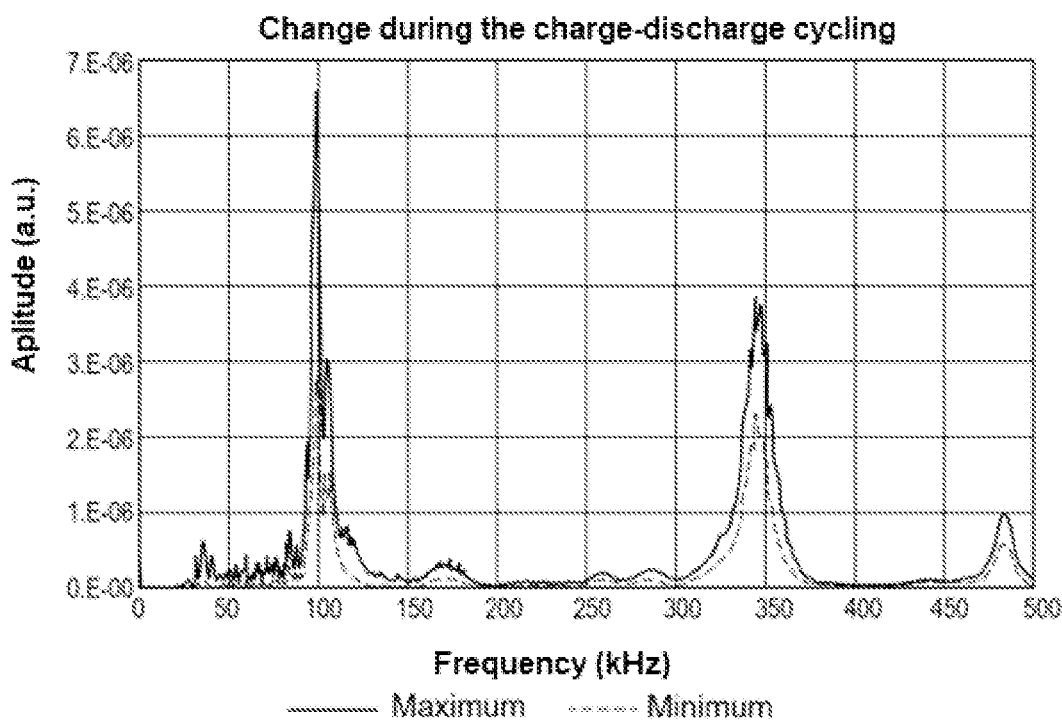
[Fig. 4]
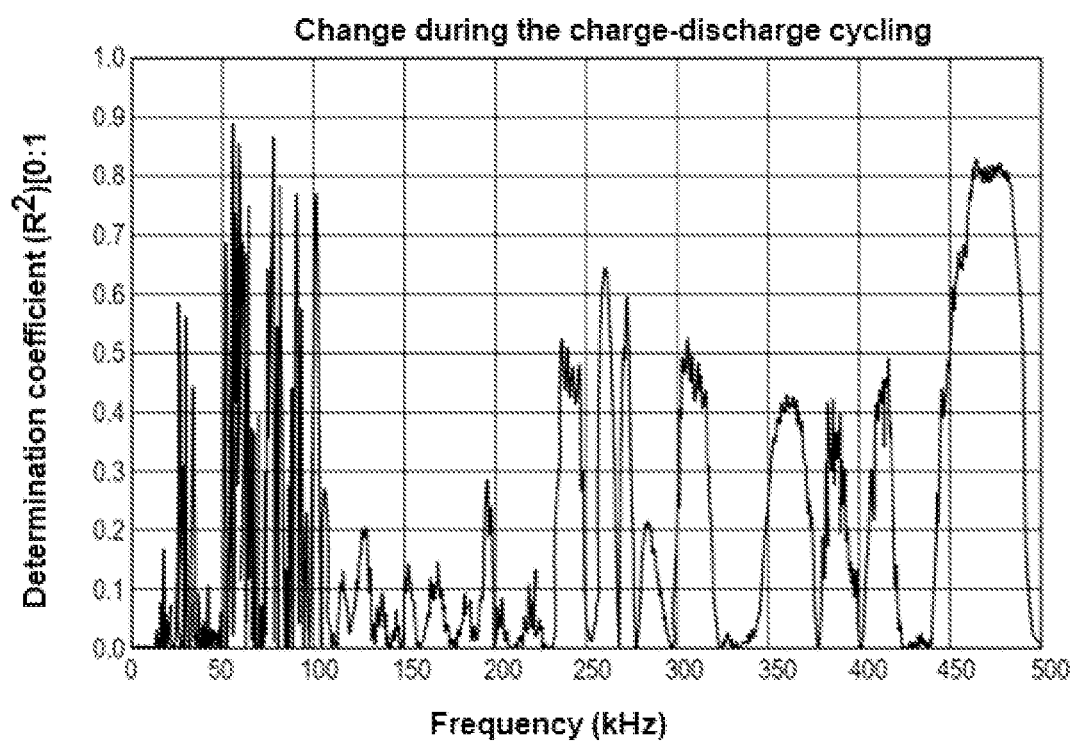

[Fig. 5]
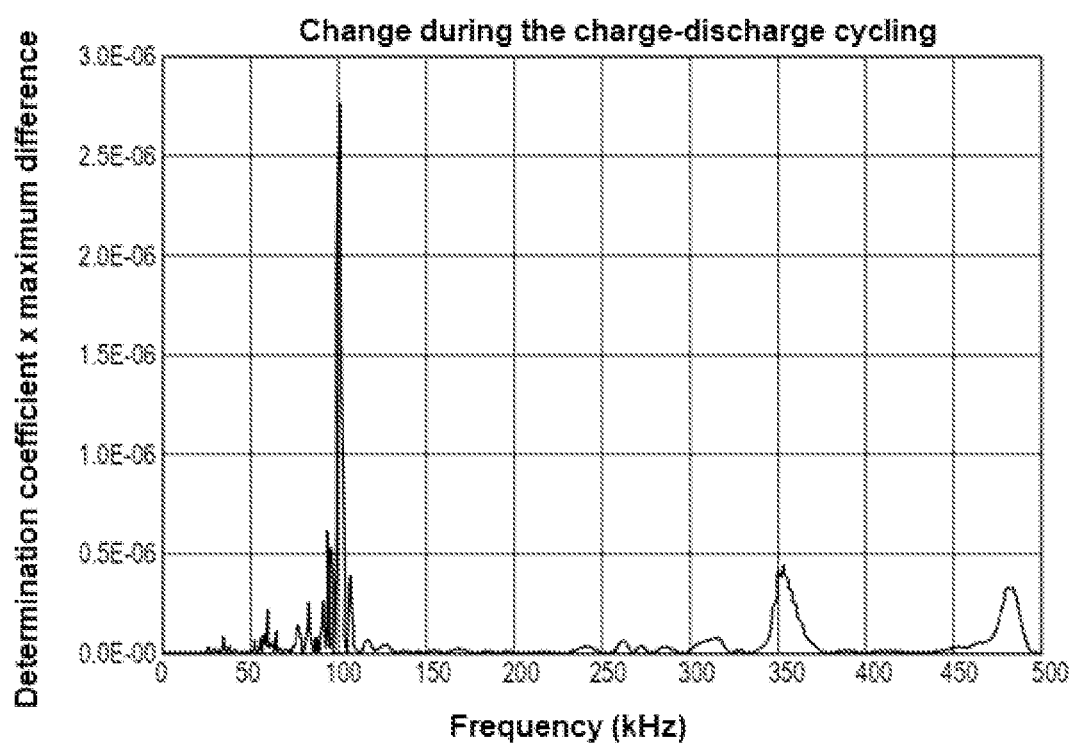

[Fig. 6]
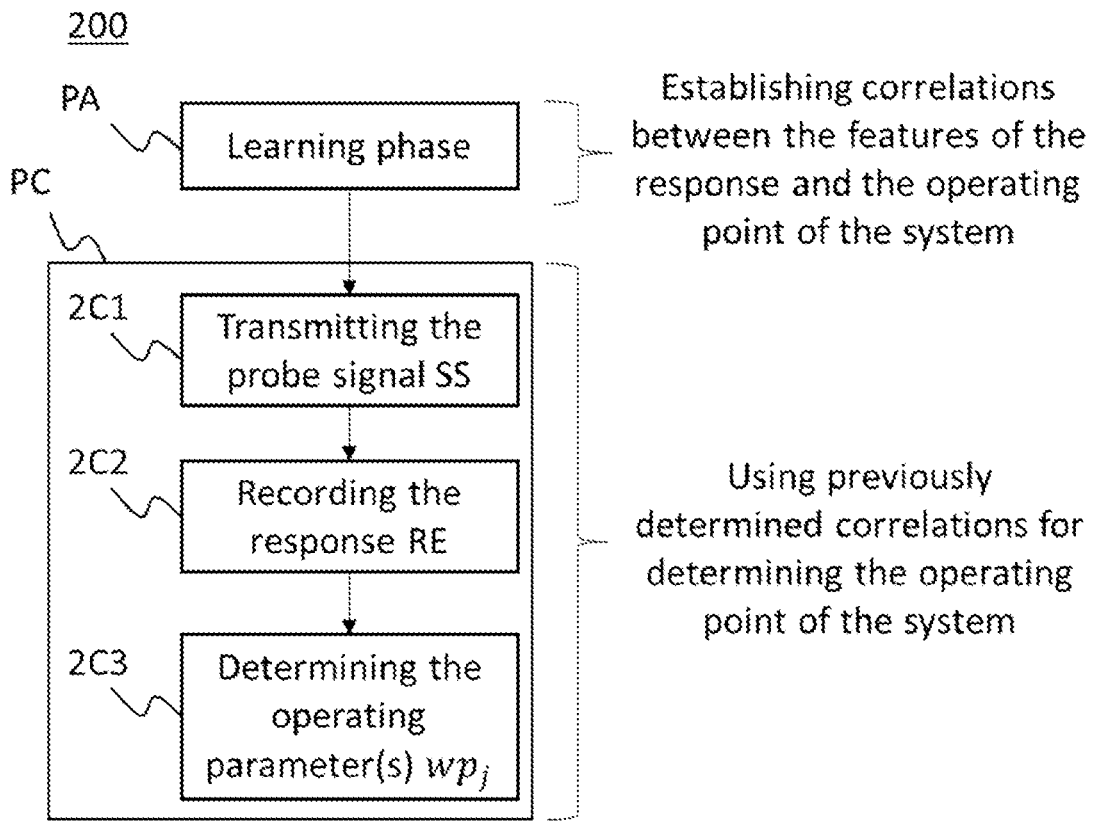
[Fig. 7]
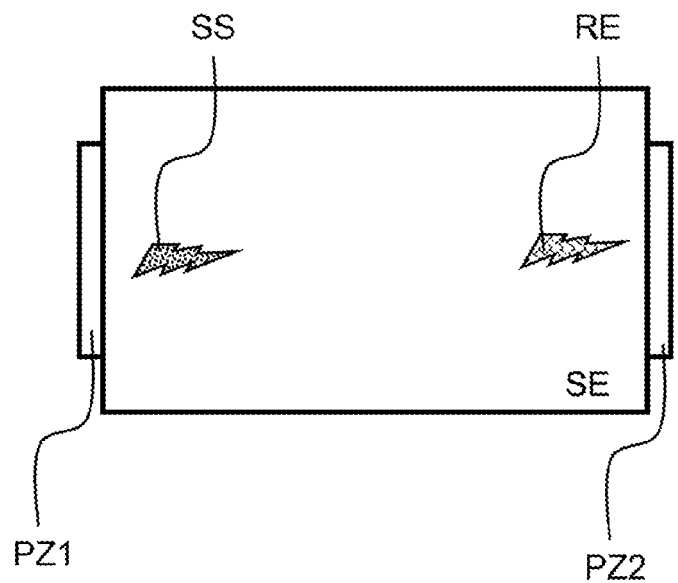

[Fig. 8]
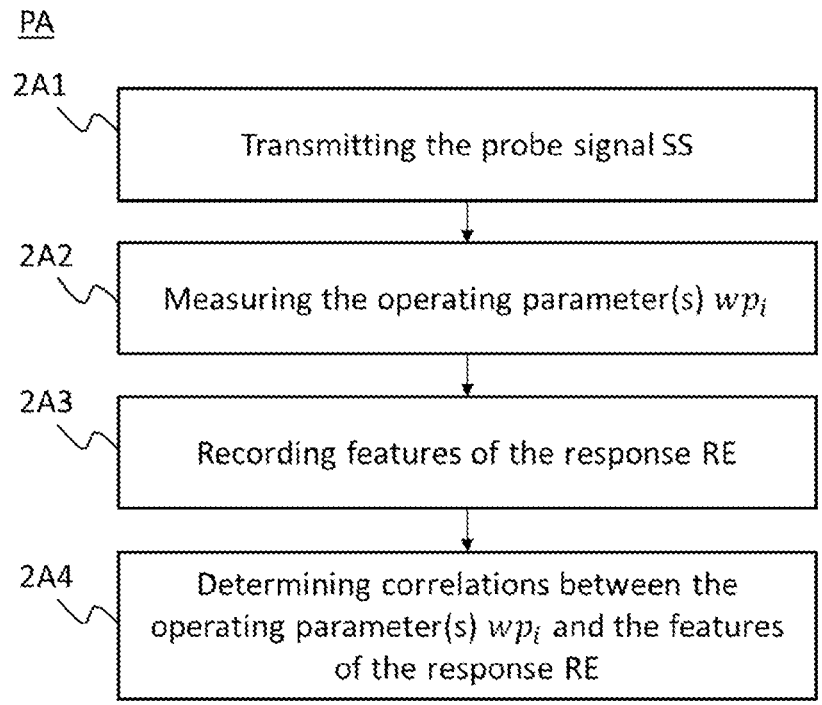
[Fig. 9]
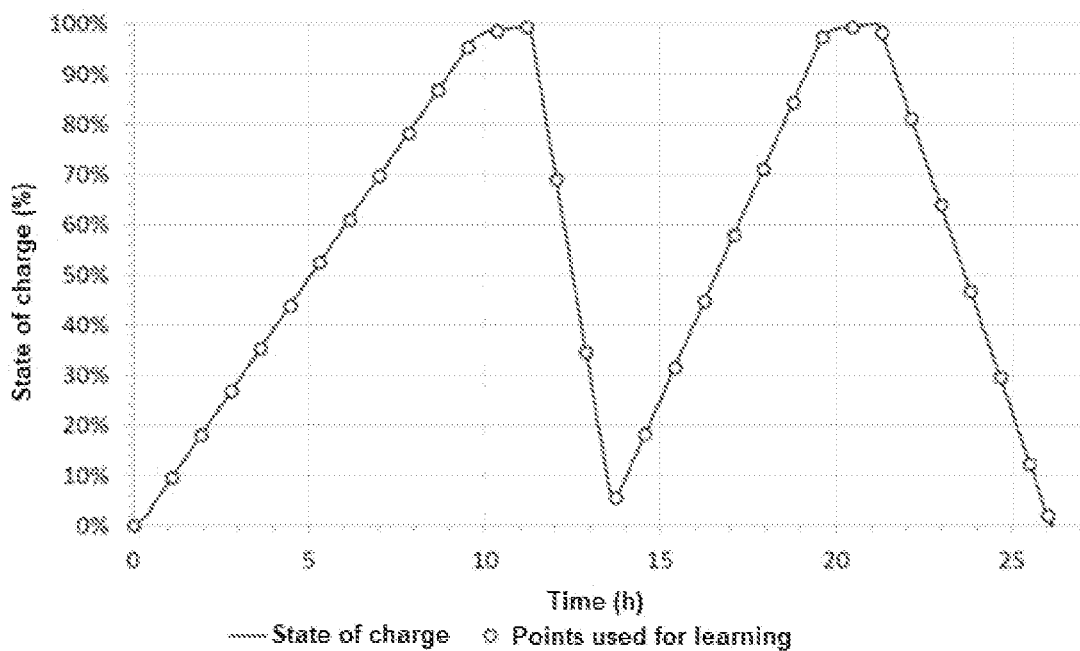

[Fig. 10]
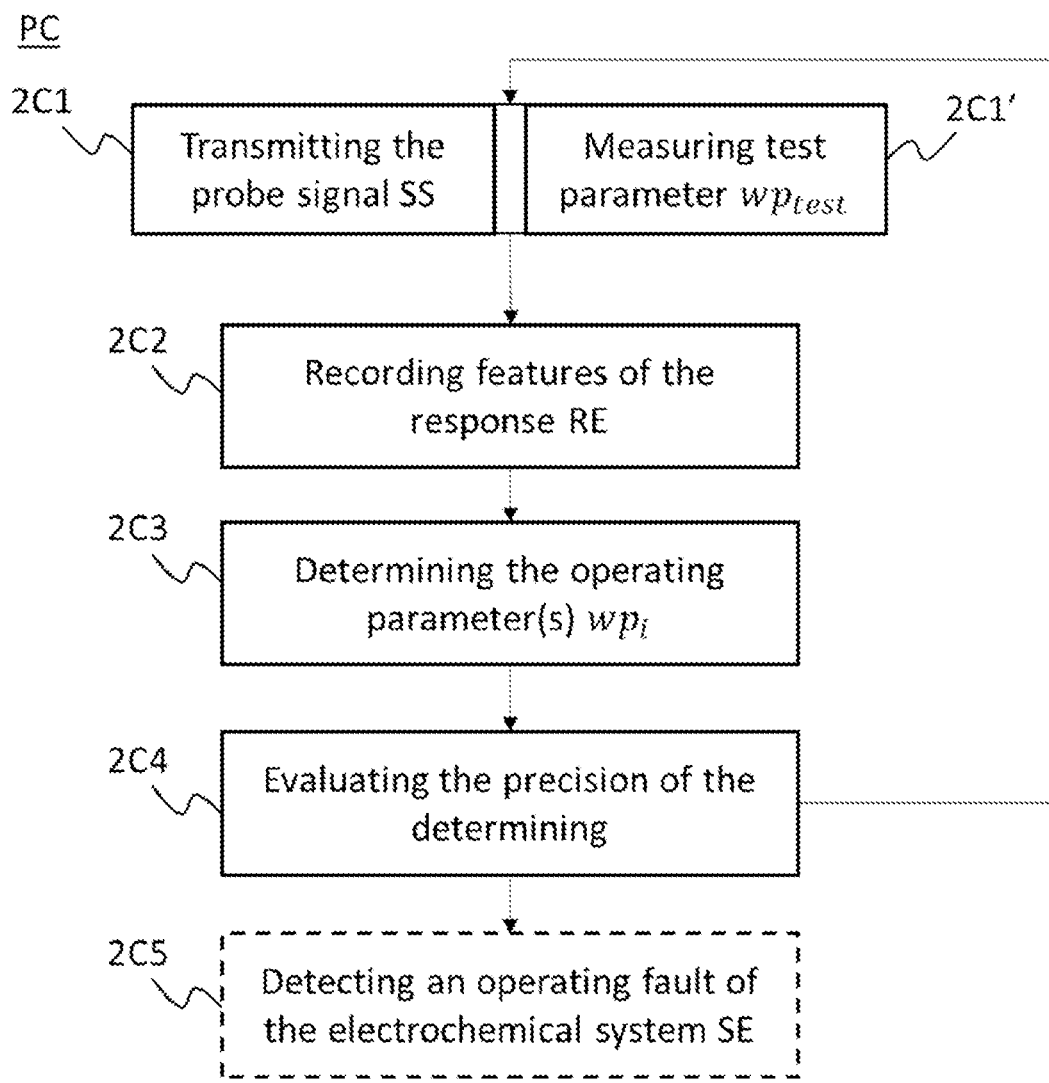

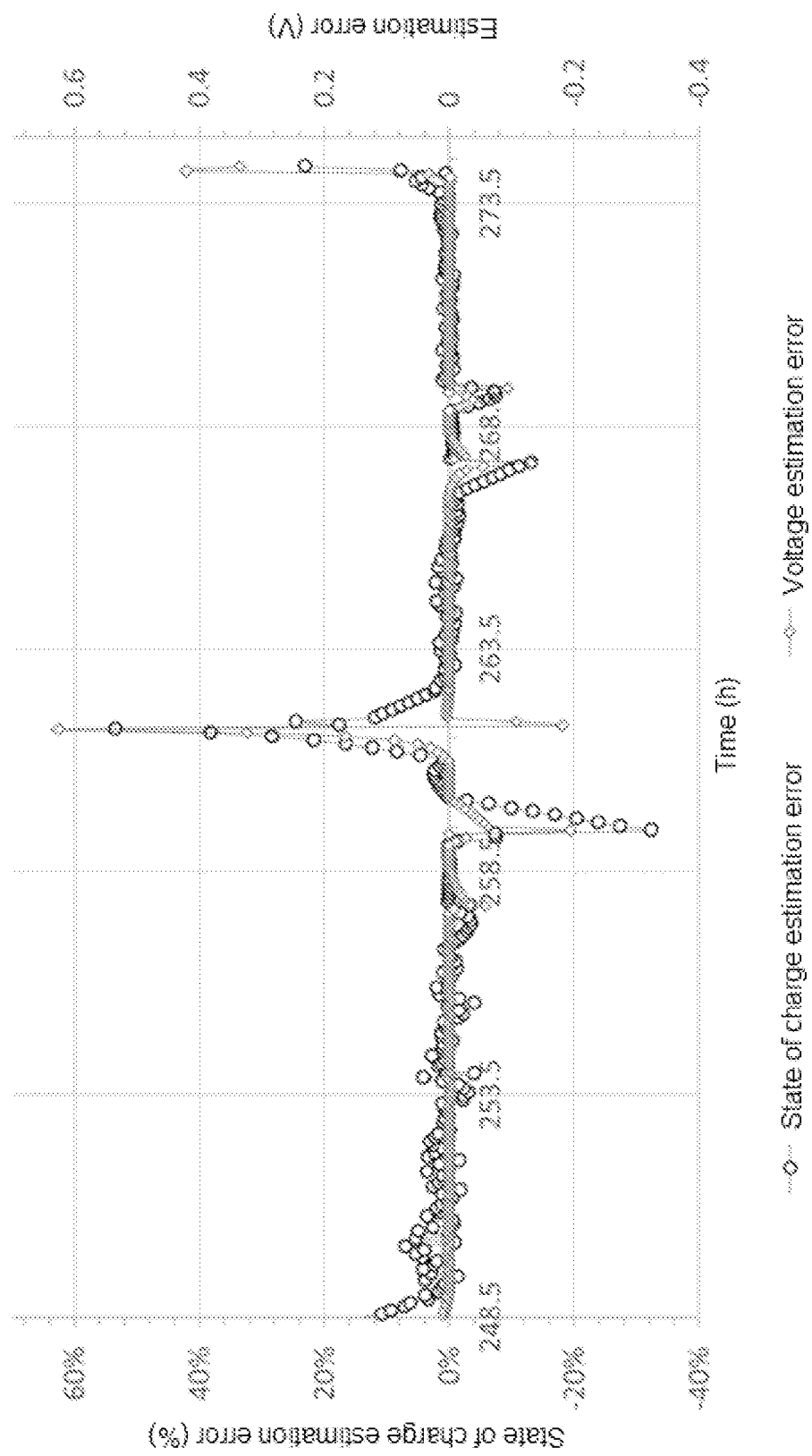
[Fig. 11]

[Fig. 12]
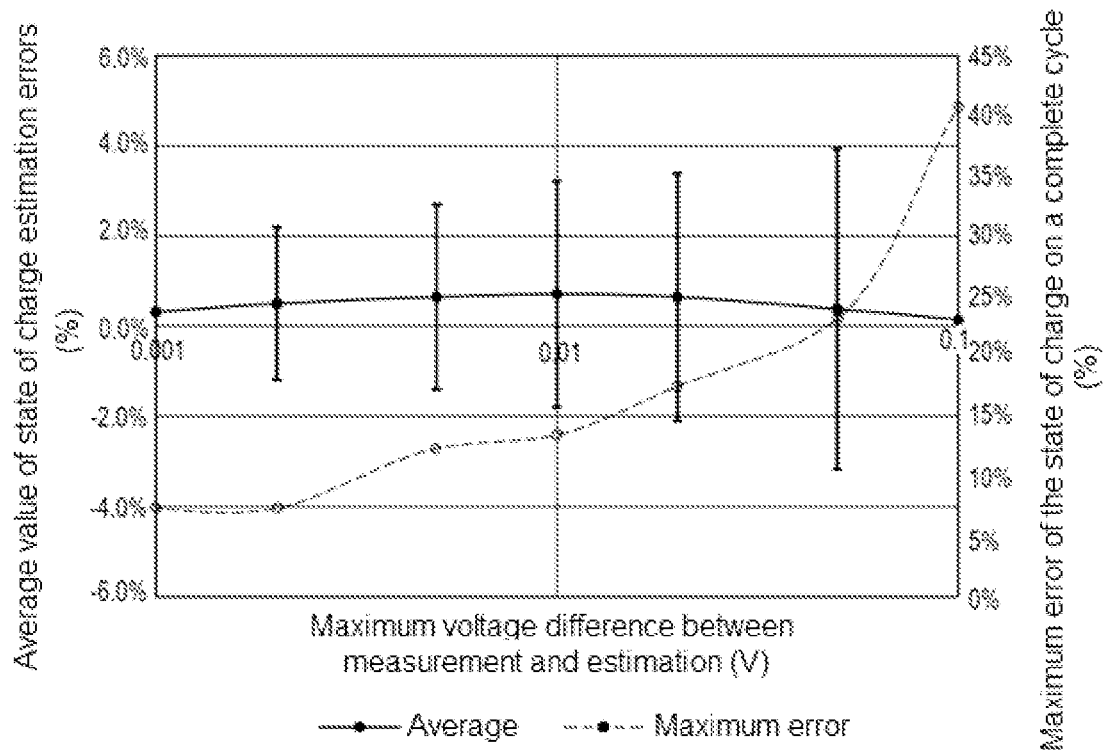

METHOD FOR DETERMINING A PROBE SIGNAL, CHARACTERISATION METHOD USING SUCH A SIGNAL AND DEVICE THEREOF

CROSS-REFERENCE TO RELATED APPLICATIONS

This application is the U.S. National Stage of PCT/EP2020/085692, filed Dec. 11, 2020, which in turn claims priority to France patent application number 1914516 filed Dec. 16, 2019. The content of these applications are incorporated herein by reference in their entirety.

TECHNICAL FIELD OF THE INVENTION

The technical field of the invention is that of non-intrusive diagnosis of electrochemical systems for converting energy.

The present invention relates more particularly to a method using acoustic characterisation techniques.

TECHNOLOGICAL BACKGROUND OF THE INVENTION

Systems for monitoring and managing batteries are indispensable in order to satisfy the most effectively possible the demands of users. Generally, the monitoring and managing systems take into account the state of charge of the battery, the state of health of the battery and/or the state of safety of the battery (for example by detecting abnormal operation). This different information is generally obtained by measuring electrical magnitudes at the terminals of the battery, but also through external data such as that provided by thermal analysis techniques (measurement of temperature and/or of heat flux) or non-destructive control (acoustic characterisation for example). From information obtained through measurements, the management systems adjust the operation of the battery in order to optimise the performance thereof and guarantee the safety of the assembly.

The currently proposed techniques for monitoring batteries in operation via ultrasound acoustic signals (Gold et al., 2017; Sood, Pecht, & Osterman, 2016; Steingart et al., 2016, DE102015210266A1) have certain disadvantages however. First of all, they take interest only in certain operating parameters of the battery independently of one another (stage of charge, state of health, temperature) and do not take into consideration all of the information contained in the acoustic signal measured. Very often, the signals used for the acoustic interrogation are limited to a few pulses of a very short duration. The features of the acoustic signal used are then substantially the flight time (time interval between the transmission of the signal and the reception thereof—see documents US 20180120168A1, US20180120261A1 and U.S. Pat. No. 10,132,781 B2.

The operating parameters are then estimated from a very succinct piece of information. By way of example, the same feature of the measured acoustic signal, the flight time, which does not contain a lot of information in itself, can thus be used to estimate all together the temperature (US 2018/0120168 A1), the state of charge or the state of health (US 2016/0197382 A1) of a battery.

Although there is no doubt that information pertaining to the temperature, the state of charge and the state of health are contained in the value of the flight time, it seems difficult to determine each one of these parameters independently from the others if they are all changing during the operation of the battery.

Generally, the methods that can be used to estimate the temperature and the operating parameters (or state) which are the state of charge and the state of health from the change in the acoustic signals transmitted are based on a machine learning method. This method first of all requires a step of learning during which a correlation will be established between a feature of the measured acoustic signal (for example flight time of the acoustic signal) and a parameter of known state (for example the state of charge). Several measurements are required in order for the learning to take place over the entire operating range of the battery (typically between 0 and 100% of the state of charge). In order to reduce the number of points required for the learning, it is possible to sample these points over the operating range (for example every 5 or 10% of state of charge) and, between two points used for the learning, to establish the correlation between the operating parameter and the measurements coming from the acoustic signal with a specific mathematic function (linear, exponential, power, etc. . . . ).

This results in that the learning has to be carried out over all the operating ranges of the battery relative to the parameters that will have a notable influence on the response to the acoustic signal. This is the case for the state of charge but also for the temperature of the battery and possibly for the electric current that passes through it. To guarantee a precise estimation of the state of charge of a battery from the acoustic signal, it is necessary to establish a correlation between the state of charge and the acoustic signal over all the state of charge ranges and this, in all the temperature and current conditions in charge and discharge allowed for the operation of the battery.

Such learning therefore requires a very large number of measurements. Furthermore, this learning is valid only if the system is stabilised and the acoustic response is perfectly repeatable. Unfortunately, during ageing, the acoustic signal transmitted will change and the learning will no longer be valid. The estimation supplied by the algorithm will progressively lose in reliability without it being it possible to quantify this error.

There is therefore a need for a method that makes it possible to precisely estimate and in a robust manner the values of the main indicators of states and operating parameters (temperature for example) from acoustic signals transmitted while still overcoming at least partially the problems presented hereinabove. There is also a need for a method that makes it possible to check the validity of the estimations produced.

SUMMARY OF THE INVENTION

The invention offers a solution to the problems mentioned hereinabove, by making it possible to determine a probe signal optimised for the monitoring of an electrochemical system and to use such a probe signal to establish a correlation between at least one operating parameter of the system and a plurality of features of the response of the system to said probe signal.

An aspect of the invention relates to a method for determining a probe signal for acoustically characterising an electrochemical system, the probe signal being determined by means of an identification signal transmitted in a reference electrochemical system so as to induce a response from the reference electrochemical system, the method comprising, for a plurality of operating points $\{PF_i\}$ of the reference electrochemical system, each operating point $PF_i$ being defined by at least one operating parameter $wp_j^i$ of the reference electrochemical system:

a step of transmitting the identification signal, the identification signal being composed of a plurality of frequencies over a predetermined bandwidth and being chosen so as to establish a steady state within the reference electrochemical system and induce a linear response within the reference electrochemical system;

a step of measuring the response of the reference electrochemical system to the identification signal;

in such a way as to obtain a plurality of responses of the reference electrochemical system, each response being associated with a given operating point $PF_i$ the method further comprising:

a step of determining correlations between the operating parameter or parameters $wp_j^i$ defining the considered operating point $PF_i$ and at least one feature of the response of the reference electrochemical system;

a step of determining a probe signal from the feature or features $wp_i$ having a correlation with the operating parameter or parameters $wp_i$ above a predetermined threshold value.

The probe signal obtained thanks to the method according to a first aspect of the invention is adapted to the system to be characterised, to the operating parameters of the system that is to be determined and to the features of the response that are most suitable to the characterisation in question.

In addition to the features that have just been mentioned in the preceding paragraph, the method according to a first aspect of the invention can have one or more additional features among the following, taken individually or according to any technically permissible combination.

In an embodiment, the response of the electrochemical system is associated with at least one time feature $ct_i$ and/or with at least one frequency feature $cf_i$.

In an embodiment, the variation in the feature or features of the response of the electrochemical system between two extreme values of the operating parameter $wp_i$ or of at least one operating parameter $wp_i$ among the operating parameters $wp_i$ is also taken into account during the step of determining a probe signal.

A second aspect of the invention relates to a method for acoustically characterising an electrochemical system by means of a probe signal obtained using a method according to a first aspect of the invention, the method comprising a learning phase making it possible to establish correlations between at least one operating parameter $wp_i$ of the electrochemical system and at least two features of the response of the electrochemical system to the probe signal chosen from at least one time feature $ct_i$ and/or at least one frequency feature $cf_i$; and a characterisation phase of the state of the electrochemical system comprising:

a step of transmitting the probe signal in the electrochemical system in such a way as to induce a response in the electrochemical system; a step of recording the response of the electrochemical system to the probe signal, the recording concerning the chosen features of the response;

a step of determining the operating parameter or parameters $wp_i$ from features of the response recorded during the step of recording the response and from correlations determined during the learning phase.

In addition to the features that have just been mentioned in the preceding paragraph, the method according to a second aspect of the invention can have one or more additional features among the following, taken individually or according to any technically permissible combination.

In an embodiment, the correlations established during the learning phase concern at least one first operating parameter $wp_i$ and a second operating parameter, referred to as test parameter $wp_{test}$, said parameters having been taken into account during the determining of the probe signal, and the characterisation phase comprises:

a step of measuring the test parameter $wp_{test}$ this step of measuring being concurrent with the step of transmitting the probe signal of the characterisation phase;

after the step of determining the operating parameter or parameters $wp_i$, a step of evaluating the precision of the determining according to the measured value of the test parameter $wp_{test}$ and the value determined using correlations of this same parameter.

In an embodiment, during the characterisation phase, when the precision evaluated during the step of evaluating the precision is below a predetermined threshold, the value of the parameter or parameters determined using correlations is invalidated.

In an embodiment, during the characterisation phase, when the values of the operating parameters $wp_j$ are invalidated, the value of these operating parameters $wp_j$ is determined according to the last known value of said parameters.

In an embodiment, the steps of the characterisation phase are repeated at regular intervals and wherein, when during a number of successive iterations greater than or equal to a predetermined threshold, the value of the operating parameter or parameters $wp_j$ determined using correlations is invalidated, the characterisation phase (PC) comprising a step of detecting an operating fault of the electrochemical system.

In an embodiment, the learning phase comprises, for at least one standard electrochemical system and for each operating point $PF_i$ of a plurality of operating points $\{PF_i\}$:

a step of transmitting the probe signal in such a way as to induce a response in the electrochemical system;

a step of measuring the operating parameter or parameters $wp_i$ of the standard electrochemical system relative to the operating point $CF_i$, this step of measuring being concurrent with the step of transmitting the probe signal;

a step of recording the response of the electrochemical system to the probe signal, the recording concerning at least two features of the response chosen from at least one time feature $ct_i$ and/or at least one frequency feature $cf_i$;

in such a way as to obtain a plurality of recordings of the response; the learning phase further comprising a step of determining correlations between the operating parameter or parameters $wp_i$ measured and the chosen features of the response.

In an embodiment, during the step of determining correlations, each operating parameter $wp_i$ is weighted.

In an embodiment, a plurality of operating parameters $\{wp_i\}$ is measured during the step of measuring the operating parameter or parameters $wp_i$ and, during the step of determining correlations, the determining of correlations for a given operating parameter $wp_i$ takes into account the other operating parameters $wp_j$.

A third aspect of the invention relates to a device comprising means configured to implement a method according to a first or a second aspect of the invention.

A fourth aspect of the invention relates to a computer program comprising instructions that, when the program is executed by a computer, lead the latter to implement the method according to the first or the second aspect of the invention.

A fifth aspect of the invention relates to a computer-readable storage medium on which is recorded the computer program according to a fourth aspect of the invention.

A sixth aspect of the invention relates to a method for managing an electrochemical system implementing a method according to a first or a second aspect of the invention.

The invention and its different applications shall be better understood when reading the following description and examining the accompanying figures.

BRIEF DESCRIPTION OF THE FIGURES

The figures are presented for the purposes of information and in no way limit the invention.

FIG. 1 shows a flowchart of a method according to a first aspect of the invention.

FIG. 2 shows a diagrammatical representation of a method according to a first aspect of the invention.

FIG. 3 shows the minimum and maximum values of power spectral density of the response during a complete charge-discharge cycle of a battery.

FIG. 4 shows the change in the determination coefficient (quality of the prediction of a linear regression) between the spectral density of the response and the state of charge of the battery during a complete charge-discharge cycle.

FIG. 5 shows the change as a function of the frequency of an aggregate indicator taking account of the determination coefficient between the power spectral density of the response and the state of charge and the maximum difference measured of the variation in the power spectral density of the response of the battery during a complete charge-discharge cycle.

FIG. 6 shows a flowchart of a method according to a second aspect of the invention.

FIG. 7 shows a diagrammatical representation of a method according to a second aspect of the invention.

FIG. 8 shows a flowchart of the learning phase of a method according to a second aspect of the invention.

FIG. 9 shows a graph illustrating the change in the state of charge of an electrochemical system over time used for the learning phase.

FIG. 10 shows a flowchart of the characterisation phase of a method according to a second aspect of the invention.

FIG. 11 shows the correlation between the error in the determination of the state of charge and the error in the determination of the voltage at the terminals of the electrochemical system.

FIG. 12 shows the measurement of a quality factor of the determination from correlations.

DETAILED DESCRIPTION

Unless mentioned otherwise, the same element appearing in different figures has a unique reference.

Determining a Probe Signal

A first aspect of the invention shown in [FIG. 1] and [FIG. 2] relates to a method 100 for determining a probe signal SS for acoustically characterising an electrochemical system SE. In the method 100 according to a first aspect of the invention, the determining of the probe signal SS is done using an identification signal SI transmitted in a reference electrochemical system SE in such a way as to induce an acoustic response RE of the reference electrochemical system SE. The reference electrochemical system SE can be a battery, a fuel cell or, more generally, any electrochemical system for converting energy.

The method 100 according to a first aspect of the invention comprises a step of 1E1 of transmitting the identification signal SI, the identification signal SI being composed of a plurality of frequencies over a predefined bandwidth, the identification signal SI being chosen in such a way as to establish a steady state within the electrochemical system SE and induce a linear response within the electrochemical system SE. The bandwidth can for example be chosen according to measurements already known on a similar system and/or according to the features of the means used to generate the identification SI signal (or the probe signal SS). The identification signal SI can for example be generated by a piezoelectric transducer PZ1 fixed on the electrochemical system SE.

It is possible to be sure of the linear response of the electrochemical system SE by checking, for a given identification signal SI, that a slight variation in the amplitude of said signal SI at the different frequencies comprising the identification signal SI is associated with a linear variation of the power transmitted. If this linearity is not observed, it is then necessary to decrease the amplitude of the identification signal SI until such a linearity is obtained. Preferably, this linearity will be checked for each frequency of the identification signal SI.

Establishing a steady state imposes a few restrictions on the identification signal SI used: it is generally difficult to use an identification signal SI established randomly (white noise or other coloured noise) because this random nature does not make it possible to establish a steady state. Indeed, the latter can require several tens of microseconds to be established (several successive periods at each frequency). For example, the identification signal SI can be obtained by proceeding with a frequency scan between two extreme values such as $f_{min}=10$ kHz and $f_{max}=1$ MHz according to a linear or logarithmic variation in the frequency with time. Alternatively, the identification signal SI can be simpler (for example, a few punctual frequencies chosen from prior knowledge on identical or similar electrochemical systems SE) or more complex (random selection of a frequency sampling). Moreover, the amplitude of the identification signal SI can be chosen as constant over the entire frequency range or variable with monotones or complex variations in the amplitude with the frequency.

The method then comprises a step 1E2 of measuring the response RE of the electrochemical system SE to the identification signal SI. This response RE can for example be measured by means of piezoelectric transducer PZ2 fixed on the electrochemical system SE. This transducer can be the same as the one having generated the identification signal SI or then a transducer different from the latter.

The response RE of the electrochemical system SE (i.e. the transmitted acoustic signal) contains a large number of information pertaining to the physical properties of the materials that comprise the electrochemical system SE and to the variations of these physical properties during the operation of the electrochemical system SE in question. For example, the temperature can vary the physical properties of all the materials that comprise the electrochemical system SE (electrodes, electrolyte, separator, current collector, packaging, etc.) with variations in density and the elasticity modulus. Likewise, the state of charge of the electrochemical system SE can have a direct influence on the physical properties of the electrodes (change in crystalline structure, variation in volume) and also on those of the electrolyte for certain battery chemistries (Pb-acid, Ni—Cd, Ni-MH, flow batteries, etc.) of which the density of the electrolyte changes with the state of charge. In the same way, the state of health will have an influence on all the materials of the electrochemical system SE. According to the ageing mechanisms specific to each electrochemical system SE certain materials will be more impacted than others. Very often, it is a variation in density of the electrochemical system SE which is observed (generally due to an inflating due to an accumulation of gas produced by degradation of the electrolyte).

These two steps are implemented for a plurality of operating points $\{PF_i\}$ of the electrochemical system SE, each operating point $PF_i$ being defined by at least one operating parameter $wp_j^i$ of the electrochemical system SE, preferably by a plurality of operating parameters $\{wp_j^i\}$ where i is the index relative to the considered operating point $PF_i$ and j is the index of the operating parameter relative to the considered operating point $PF_i$ (when reference is made to an operating parameter in a general way, i.e. without reference to an operating point in particular, the index relative to the operating point is omitted). To give a few examples, an operating parameter $wp_j$ according to the invention can be the state of charge, the state of health, the voltage at the terminals of the electrochemical system SE, the temperature of the electrochemical system, etc.

Thus, a plurality of responses RE of the electrochemical system SE is obtained, each response RE being associated with a given operating point $PF_i$ defined by one or more operating parameters $wp_j^i$. Indeed, to evaluate the influence of the operating parameters $wp_j$ on the response RE of the electrochemical system SE, it is preferable to have measurements taken for different operating points $PF_i$ (i.e. in different operating conditions). To give an example, the two steps described hereinabove can be implemented over a plurality of charge—discharge cycles at a nominal state defined according to the target application and the technical data supplied by the manufacturer and for two different temperatures. These two temperatures can for example be the extreme values of the use considered. In this example, each operating point $PF_i$ will be defined by means of the following operating parameters: the state of charge of the electrochemical system SE, the temperature of the electrochemical system SE and, possibly, the state of health of the electrochemical system SE. Of course this is only an example and the plurality of operating points $\{PF_i\}$ of the electrochemical system SE can be chosen differently.

An example of a measurement of the power spectral density of the response RE during the cycling of an electrochemical system (here, a battery) is shown in [FIG. 3], the considered operating parameter $wp_i$ being here the state of charge. This figure shows on the abscissa the considered frequency of the response RE of the electrochemical system SE and on the ordinates the minimum value and the maximum value of the spectral density measured during the cycling for the considered frequency, with the thick line curve corresponding to the maximum value and the curve as a thin line corresponding to the minimum value. In this example, the identification signal SI was obtained by frequency scanning between 20 and 500 kHz. The power spectral density of the response RE of the electrochemical system SE changes substantially with the frequency. More particularly, the response RE of the electrochemical system SE is very strong around 100 kHz and 350 kHz. On the other hand, it is very low between 200 and 250 kHz or between 400 and 450 kHz.

Once this plurality of responses RE has been obtained, the method comprises a step 1E3 for determining the correlation between at least one operating parameter $wp_i$ and at least one feature of the response RE of the electrochemical system SE.

Preferably, the correlation is evaluated using the correlation coefficient and/or the determination coefficient (generally noted as $R^2$). Taking the same example as in [FIG. 3], [FIG. 4] shows the determination coefficient between the state of charge of the electrochemical system SE and the power spectral density of the response RE of the electrochemical system SE for a given frequency. As this figure shows, the determination coefficient can change substantially with the frequency of the identification signal SI. In particular, this determination coefficient can be greater than 0.8 for certain frequencies, which means that there is a rather good correlation (linear regression) between the state of charge and the value of the power spectral density of the response RE to these frequencies, and zero at other frequencies (no linear relationship between the values measured). It is thus possible to determine the frequencies that are the most sensitive to a given operating parameter $wp_j$, then to determine a probe signal SS based on the correlation between the considered operating parameter $wp_j$ and the response RE of the electrochemical system SE.

For this, the method then comprises a step 1E4 of determining a probe signal SS from the feature or features of the response RE having a correlation with the operating parameter or parameters $wp_j$ above a predetermined threshold value. To return to the example of [FIG. 4], the probe signal SS thus determined could comprise only the frequencies for which the determination coefficient is greater than 0.8.

It is however possible that in the frequencies retained there are frequencies for which the difference in amplitude of the feature or features of the response RE between two extreme values of the parameter or parameters $wp_j$ of interest is relatively low. This can in certain cases make the measurement difficult and therefore the determining of the operating parameter or parameters $wp_j$ of interest.

Also, in an embodiment, the variation in the feature or features (time $ct_i$ and/or frequencies $cf_i$) of the response RE (for example in the spectral density of the response RE) of the electrochemical system SE between two extreme values of the operating parameter $wp_i$ (when interest is given to only a single parameter) or of at least one operating parameter $wp_i$ among the operating parameters $wp_i$ (when interest is given to a plurality of operating parameters $wp_i$) is also taken into account during the step 1E4 of determining a probe signal SS. In an embodiment shown in [FIG. 5], this taking into account is carried out through an indicator that takes into account the variation in the spectral density and the correlation of the response of the system relatively to an operating parameter $wp_i$, here, the state of charge. This taking into account can be done in different ways. For example, to guarantee good precision, it is possible to substantially weight the determination coefficient. If on the other hand the response RE of the electrochemical system SE for a given frequency is close to the detection threshold of the sensor PZ2 used to record the response RE of the electrochemical system SE, it is possible to add more weight to the difference in amplitude of the signal during cycling in such a way as to favour the frequencies for which the variation in amplitude is the highest. In [FIG. 5], an identical weighting for the variation and the correlation (calculated here using a determination coefficient) was adopted.

From this aggregate indicator (equal to the product between the determination coefficient and the maximum difference in amplitude during cycling), it is then possible to select the frequencies composing the probe signal SS. In particular, the value of this indicator is very substantial around 100 kHz, 350 kHz and 480 kHz. Also, it is possible to select only certain frequencies for which the value of the aggregate indicator is greater than a threshold value or to select only the frequencies for which this aggregate indicator has the highest values (for example selecting only the frequencies for which the aggregate indicator is within the highest 10%).

Interest Feature of the Response RE

The information contained in the response RE of the electrochemical system SE that can be used in a method 100 according to a first aspect of the invention or a method 200 according to a second aspect of the invention (which shall be presented in what follows) are of different natures:

- the time features $ct_i$: the flight time of the signal, the duration of the signal received, the waveform (variation in amplitude as a function of time), the time interval between the start of the reception of the wave and the maximum amplitude, etc.;
- the frequency features $cf_i$: the power spectral density (power of the signal transmitted for each frequency that the signal is comprised of), the average frequency, the energy of the signal, its force, etc.

Generally, the frequency features $cf_i$ are obtained by carrying out a Fourier transform of the response RE of the electrochemical system SE. All of this information can be collected and recorded in a memory, for example in the form of a table of which each line corresponds to the time at which the response RE of the electrochemical system SE to an identification signal SI or to a probe signal SS was measured and which is comprised of several columns relative to the time $ct_i$ and frequency $cf_i$ features (for example several thousand columns for the waveform and 1024 columns for the power spectral density).

However, all the features of the response RE are not relevant, but depend on the type of electrochemical system SE studied, on its format and/or on the operating parameter or parameters $wp_j$ that must be estimated. When a probe signal SS determined using a method 100 according to a first aspect of the invention for the characterisation of an electrochemical system SE is used, it is therefore preferable to concentrate the analysis of the response RE of the electrochemical system SE to the probe signal SS thus determined on the operating parameter or parameters $wp_j$ and the feature or features (for example, time $ct_i$ and/or frequency $cf_i$) of the response RE for which the probe signal SS has been determined using said method 100.

Acoustic Characterisation of an Electrochemical System

Once a probe signal SS has been determined using a method 100 according to a first aspect of the invention, it is possible to use such a probe signal SS to acoustically characterise the operating point $PF_i$ of an electrochemical system SE, for example a battery. More particularly, the characterisation will relate to the operating parameter or parameters $wp_j$ having been taken into account during the determining of the probe signal SS and will take into account the feature or features of the response RE of the electrochemical system SE taken into account during the determining of the probe signal SS. For this, a second aspect of the invention shown in [FIG. 6] and in [FIG. 7] relates to a method 200 for acoustically characterising an electrochemical system SE by means of a probe signal SS obtained using a method 100 as described hereinabove by taking account of at least one operating parameter $wp_j$ of the electrochemical system SE and at least two features of the response RE of the electrochemical system SE to the probe signal SS chosen from at least one time feature $ct_i$ and/or at least one frequency feature $cf_i$ (for example, the two features could be two time features $ct_i$, two frequency features $cf_i$ or a time feature $ct_i$ and a frequency feature $cf_i$). The method 200 according to a second aspect of the invention comprises a learning phase PA making it possible to establish correlations between the operating parameter or parameters $wp_j$ of the electrochemical system SE and the features of the response RE of the system to the probe signal SS chosen (i.e. chosen from at least one time feature $ct_i$ and/or at least one frequency feature $cf_i$). The method 200 according to a second aspect of the invention also comprises a characterisation phase PC of the state of the electrochemical system.

Learning Phase

As already mentioned, the method according to a second aspect of the invention comprises a learning PA. This learning phase PA can be carried out on a standard electrochemical system SE or on a plurality of standard electrochemical systems SE. It can also be carried out on the target electrochemical system SE, i.e. on the electrochemical system SE whereon the characterisation phase PC will be implemented which shall be described in what follows.

As shown in [FIG. 8], this learning phase PA comprises for each standard electrochemical system SE and for each operating point $PF_i$ of a plurality of operating points $\{PF_i\}$, a step 2A1 of transmitting a probe signal SS in such a way as to induce a response RE in the standard electrochemical system SE. This probe signal SS having been obtained using a method 100 according to a first aspect of the invention, it makes it possible to establish a steady state within the electrochemical system SE and induce a linear response RE within the electrochemical system SE. The plurality of operating points $\{PF_i\}$ can for example correspond to one or more charge/discharge cycles carried out for one or more operating temperatures and/or for one or more charge/discharge current values. Of course, it is possible to take into account other operating parameters $wp_j$, the operating parameters $wp_j$ taken into account during the learning phase PA being preferably comprised in the operating parameters $wp_j$ taken into account for the establishing of the probe signal SS.

This learning phase PA also comprises for each standard electrochemical system SE and for each operating point $PF_i$ of a plurality of operating points $\{PF_i\}$, a step 2A2 of measuring at least one operating parameter $wp_j$ (preferably a plurality of operating parameters $\{wp_j\}$) of the standard electrochemical system SE relative to the operating point $PF_i$, this step of measuring being concurrent to the step 2A1 of transmitting the probe signal SS. In the same way as hereinabove, the operating parameter or parameters $wp_j$ measured during this step 2A2 are comprised in the operating parameter or parameters $wp_j$ taken into account for the establishing of the probe signal SS.

This learning phase PA further comprises a step 2A3 of recording the response RE of the electrochemical system SE to the probe signal SS, the recording concerning at least two features of the response RE chosen from at least one time feature $ct_i$ of the response and/or at least one frequency feature $cf_i$ of the response RE. Preferably, the recording relates to a plurality of time features $\{ct_i\}$ and a plurality of frequency features $\{cf_i\}$.

In addition, these steps 2A1, 2A2, 2A3 are repeated for a plurality of operating points $\{PF_i\}$ in such a way as to obtain a plurality of recordings of the response RE. Thus, each operating point $PF_i$ is characterised by at least one operating parameter $wp_j$, preferably a plurality of operating parameters $\{wp_j\}$, measured during the step 2A2 of measuring at least one operating parameter $wp_j$. In addition, each operating point $PF_i$ is associated with at least two features of the response RE chosen from at least one time feature $ct_i$ of the response (preferably a plurality of time features $\{ct_i\}$ of the response RE) and/or with at least one frequency feature $cf_i$ of the response (preferably a plurality of frequency features $\{cf_i\}$ of the response RE). A database of the operating points $\{PF_i\}$ and of the responses RE of the associated electrochemical system SE is thus constituted.

From this data, it will be possible, via a learning method, to establish correlations between each operating parameter $wp_j$ on the one hand and the chosen features of the response RE on the other hand. For this, the learning phase PA further comprises a step 2A4 of determining correlations between the operating parameter or parameters $wp_j$ measured and the chosen features of the response RE (i.e. the at least two features of the response RE chosen from at least one time feature $ct_i$ of the response and/or at least one frequency feature $cf_i$ of the response RE). It is useful to note that each operating parameter $wp_j$ is thus correlated with at least one time feature $ct_i$ of the response RE and/or with at least one frequency feature $cf_i$ of the response RE. What this means is that the operating parameter $wp_j$ is determined from at least two features of the response RE chosen from the time feature or features $ct_i$ and the frequency feature or features $cf_i$ of the response RE. In contrast, in the prior art, an operating parameter $wp_j$ is in general correlated with a time feature $ct_i$ (for example the flight time) or (here, the or is an exclusive or) a frequency feature $cf_i$ (for example the average frequency).

In an embodiment, each operating parameter $wp_i$ is weighted during the establishing of correlations (for example, the temperature of the electrochemical system can be weighted in such a way as to take account of its greatest influence on the features of the response RE as the current that passes through the electrochemical system SE).

In an embodiment, a plurality of operating parameters $\{wp_j\}$ is measured during the step 2A2 of measuring at least one operating parameter $wp_i$ and, during the step 2A4 of determining correlations, the determining of correlations for a given operating parameter $wp_j$ takes into account the other operating parameters $wp_k$ with $k \neq j$. For example, if during the step 2A2 of measuring at least one operating parameter $wp_j$, the state of charge and the temperature are measured, then during the step 2A4 of determining correlations, correlations will be determined between:

the state of charge on the one hand and the time $ct_i$ and/or frequency $cf_i$ features of the response RE as well as the temperature on the other hand;
the temperature on the one hand and the time $ct_i$ and/or frequency $cf_i$ features of the response RE as well as the state of charge on the other hand.

Thus, if in addition to the response RE of the electrochemical system, one or more operating parameters $wp_j$ are measured during the operation of the electrochemical system SE, this parameter or these parameters $wp_j$ can be used in addition to the response RE of the system in order to determine other operating parameters $wp_i$ that are not measured but for which a correlation was established during the learning phase PA.

An example of a learning phase PA is shown in [FIG. 9]. In this example, the operating parameter $wp_j$ used for the learning is the state of charge and the values of this parameter are distributed in a roughly uniform manner, at regular time intervals. This distribution is not however optimal because during the first discharge, there are only two operating points $PF_i$ taken into account. A possible consequence is a more difficult estimation of the state of charge of the battery.

Characterisation Phase

The characterisation phase PC of the method 200 according to a second aspect of the invention comprises a step 2C1 of transmitting the probe signal SS determined using a method according to a first 100 aspect of the invention in the electrochemical system SE in such a way as to induce a response RE in the electrochemical system SE. As mentioned hereinabove, the probe signal SS has been determined by taking into account at least one operating parameter $wp_j$ of the electrochemical system SE (preferably a plurality of operating parameters $\{wp_j\}$) and at least two features of the response RE chosen from at least one time feature $ct_i$ and/or at least one frequency feature $cf_i$.

The characterisation phase PC also comprises a step 2C2 of recording the response RE of the electrochemical system SE to the probe signal SS, the recording concerning the chosen features of the response RE (i.e. chosen from at least one time feature $ct_i$ and/or at least one frequency feature $cf_i$).

The characterisation phase then comprises a step 2C3 of determining the operating parameter or parameters $wp_j$ from features of the response RE recorded during the step 2C2 of recording the response RE and using correlations established during the learning phase PA described hereinabove.

Thus, during the characterisation phase PC, the value of one or more operating parameters $wp_j$ is determined from correlations established during the learning phase PA. It can however be interesting to ensure that the value thus determined is determined with sufficient precision.

Evaluation During Operation of the Precision of the Determination

In order to ensure a monitoring of the precision of the value of the parameter or parameters determined from correlations (in other words, check the precision of the learning), it is possible to measure the value of an operating parameter $wp_j$ that will be designated as test parameter $wp_{test}$ while still determining the value of this same test parameter $wp_{test}$ by means of correlations established during the learning phase PA. It is then possible to measure the difference between the value measured and the value determined from correlations and to deduce therefrom the precision of the determination using correlations. A test parameter $wp_{test}$ that is easy to measure will preferably be chosen such as the current passing through the electrochemical system SE and/or the voltage at the terminals of the electrochemical system SE.

For this, in an embodiment shown in [FIG. 10], an operating point $PF_i$ is defined by at least one first operating parameter $wp_j$ and a second operating parameter referred to as test parameter $wp_{test}$, said parameters having been taken into account during the determining of the probe signal SS. In addition, the characterisation phase PC comprises a step 2C1' of measuring the test parameter $wp_{test}$, this step 2C1' of measuring being concurrent with the step 2C1 of transmitting the probe signal SS of the characterisation phase.

In addition, in this embodiment, the characterisation phase PC comprises, after the step 2C3 of determining the operating parameter or parameters $wp_i$ of the characterisation phase PC, a step 2C4 of evaluating the precision of the determining according to the measured value of the test parameter $wp_{test}$ and the value determined using correlations of this same parameter $wp_{test}$.

Thus, it is possible to evaluate the precision based on the use of correlations during the operation of the electrochemical system SE by comparing the measured value of a parameter $wp_{test}$ and this same value determined from correlations. If the values are close, it can then be considered that the determination from correlations can be correct for the parameter $wp_{test}$ in question, but also for the other parameters determined using correlations. This property is for example shown in [FIG. 11] which shows the error in the determination of the value of the state of charge and of the voltage at the terminals of the electrochemical system SE. Note the strong correlation between these two errors: in this example the error on the determination of the voltage from correlations could be evaluated so as to know the error concerning the state of charge. More particularly, the first operating parameter would be the state of charge (determined solely from correlations) and the test parameter $wp_{test}$ would be the voltage at the terminals of the electrochemical system SE (determined from correlations but also measured, for example using a voltmeter disposed on the electrochemical system SE, in such a way as to estimate the evaluation error of said test parameter).

In an embodiment, during the characterisation phase PC, when the precision evaluated during the step 2C4 of evaluating the precision is below a predetermined threshold, the value of the parameter or of the parameters determined using correlations is invalidated. The predetermined threshold can be defined by the user or determined statistically, for example from a standard deviation of the preceding measurements. In this latter case, the values resulting from the step 2C4 of evaluating are stored in such a way as to constitute a statistic that can then be used to determine the invalidation threshold.

In an embodiment, the precision is evaluated using a quality factor defined from the relative or absolute difference between the measured value and the determined value of the test parameter $wp_{test}$.

An example of this embodiment is shown in [FIG. 12]. This figure shows the average value (solid circles) of the quality factor defined by the relative difference between the value of the state of charge measured and the value of the state of charge determined from correlations, the maximum value (empty circles) of this quality factor as well as the standard deviation of the average value of this factor (error bars) over the entire cycle containing two chargings and two dischargings at different states. This quality factor is represented in the case where the determinations of the state of charge are considered for which the difference in voltage (taken for the test parameter $wp_{test}$) between the value measured (for example, by the system for managing the battery) and the value determined from correlations exceeds the maximum values allowed comprised between 1 mV and 100 mV.

In this example, when the maximum value of the voltage difference allowed is limited to 10 mV, the average error of the state of charge is 0.69% with a standard deviation of 2.47%. There remains however a few aberrant points for which the determination using correlations does not succeed in assigning a correct state of charge from the response RE of the electrochemical system SE. Moreover, in this example, the maximum error for estimating the state of charge on the complete cycle is 13%.

Thus, still considering this example, by choosing a maximum value of the difference in voltage allowed limited to 2 mV, the state of charge average error is slightly reduced to 0.48% but with a standard deviation of only 1.69%. Even if a few points remains for which the determination from correlations does not succeed in assigning a correct state of charge from the response RE of the system SE, the maximum error for estimating the state of charge on the complete cycle is now only 7.3%.

In an embodiment, when the value of the operating parameter or parameters $wp_i$ determined during the step 2C3 of determining the operating parameter or parameters $wp_i$ is incompatible with the operating state of the electrochemical system SE, then the value of the operating parameter or parameters $wp_j$ determined using correlations is invalidated. Such a situation can occur when the state of charge determined using correlations is increasing although the electrochemical system SE is being discharged (for example the current measured and possibly the estimated current reveal discharge operation) or when the variation in the state of charge determined using correlations is too quick to be compatible with the operation of the electrochemical system SE.

In an embodiment, during the characterisation phase PC, when the values of the operating parameters $wp_j$ are invalidated, the value of these parameters is then determined according $wp_j$ to the last known value of said parameters. For example, if the invalidated operating parameter concerns the state of charge noted as $SOC_i$, then the value of the state of charge can be determined using the following formula:

$$SOC_i = SOC_{i-1} + \int_{i-1}^{i} I \, dt$$

where i is the interval for which the value of the state of charge determined using correlations was invalidated, I is the current passing through the electrochemical system SE between the instant i−1 and the instant i and $SOC_{i-1}$ is the last value known of the state of charge, i−1 being the instant associated with this last known value.

In an embodiment, when the value of one or more invalidated parameters is determined according to the last known value of said parameters, the correlations determined during the learning phase PA are re-evaluated taking account of the value thus determined. Thus, it is possible to correct the correlations determined during the learning phase PA with these new values and thus improve the future determinations of the operating parameter or parameters $wp_j$ in question. The method 200 according to a second aspect of the invention thus makes it possible to change the learning during operation of the electrochemical system SE. Thus, thanks to the progressive adding of new points making it possible to establish new correlations, the method 200 according to a second aspect of the invention can be adapted to slow changes of the electrochemical system SE. It can in particular be adapted to the changes linked to the ageing of the system SE.

In an embodiment, the correlations are determined from all the responses RE of the electrochemical system SE recorded during the learning phase PA and recorded when the value of one or more operating parameters $wp_j$ have been invalidated. It is then possible to calculate the number of data that has been added for a given interval of time following the invalidation of one or more values of one or more operating parameters $wp_j$. An acceleration of this number per unit of time can be a sign of rapid ageing of the battery.

In an alternative embodiment, the correlations are determined from responses RE of the electrochemical system SE recorded during the learning phase PA and recorded when the value of one or more operating parameters $wp_j$ have been invalidated of which the age (i.e. the difference between the considered instant and the instant at which the recording took place) is less than a predetermined age. This makes it possible in particular to limit the size of the memory allocated for the recording of the responses RE. Here again, the number of data "forgotten" by the unit of time can reveal the ageing of the electrochemical system SE.

In an embodiment, the steps of the characterisation phase PC are repeated at regular intervals. In addition, when during a number of successive iterations greater than or equal to a predetermined threshold, the determination is invalidated, the characterisation phase comprises a step 2C5 of detecting an operating fault of the electrochemical system SE. Thus, a repeated invalidation of the values determined using correlations will be considered as being due to a defect in the electrochemical system SE.

In an embodiment, the steps of the characterisation phase PC are repeated at regular intervals. In addition, when the value of one or more operating parameters $wp_j$ is invalidated, then the interval that separates the different iterations is reduced. Such a reduction in the interval generally makes it possible to find a correct value of the parameter or parameters in question.

In an embodiment, during the characterisation phase PC, when the values of the operating parameter or parameters are invalidated, the method comprises a step of displaying and/or of sending a message warning the user that the value of the operating parameter or parameters is erroneous. Such a message can be associated with the sending of a message instructing the device for managing the electrochemical system SE to switch to degraded mode.

Device Associated with the Methods According to a First or a Second Aspect of the Invention A third aspect of the invention relates to a device comprising means configured to implement a method according to a first 100 or a second 200 aspect of the invention. In an embodiment, the device comprises means PZ1 for generating an identification signal SI or a probe signal SS within an electrochemical system SE. In an embodiment, the means for generating can be disposed removably on the electrochemical system SE. In an embodiment, the device comprises means PZ2 for receiving the response RE of the electrochemical system SE to the identification signal SI or to the probe signal SS. In an embodiment, these means for receiving can be disposed removably on the electrochemical system SE. In an embodiment, the device comprises a means for calculating (for example a processor) and a memory (for example random access memory and/or a hard drive), the memory being configured to store the instructions required for implementing a method according to a first 100 or a second 200 aspect of the invention. Moreover, the means for calculating is configured to access this memory and execute the instructions. The means for calculating is configured to control the means PZ1 for generating the probe signal SS or the identification signal SI and for receiving the data collected by the means for receiving PZ2 the response RE of the electrochemical system SE. In an embodiment, the device is a system for managing an electrochemical system SE, for example a system for managing a battery.

The invention claimed is:

1. A method for determining a probe signal for acoustically characterising an electrochemical system, the probe signal being determined by an identification signal transmitted in a reference electrochemical system so as to induce a response from the reference electrochemical system, the method comprising, for a plurality of operating points $\{PF_i\}$ of the reference electrochemical system, each operating point $PF_i$ being defined by at least one operating parameter $wp_j^i$ of the reference electrochemical system:
   a step of transmitting the identification signal, the identification signal being composed of a plurality of frequencies over a predetermined bandwidth and being chosen so as to establish a steady state within the reference electrochemical system and induce a linear response within the reference electrochemical system;
   a step of measuring the response of the reference electrochemical system to the identification signal;
   in such a way as to obtain a plurality of responses of the reference electrochemical system, each response being associated with a given operating point $PF_i$; the method further comprising:
   a step of determining correlations between the operating parameter or parameters $wp_j^i$ defining the considered operating point $PF_i$ and at least one feature of the response of the reference electrochemical system; and
   a step of determining a probe signal from the feature or features $wp_i$ having a correlation with the operating parameter or parameters $wp_i$ above a predetermined threshold value.

2. The method according to claim 1, wherein the response of the electrochemical system is associated with at least one time feature $ct_i$ and/or with at least one frequency feature $cf_i$.

3. The method according to claim 1, wherein a variation in the feature or features of the response of the electrochemical system between two extreme values of the operating parameter $wp_i$ or of at least one operating parameter $wp_i$ among the operating parameters $wp_i$ is also taken into account during the step of determining a probe signal.

4. A method for acoustically characterising an electrochemical system by a probe signal obtained using a method according to claim 1, the method comprising a learning phase making it possible to establish correlations between at least one operating parameter $wp_i$ of the electrochemical system and at least two features of the response of the electrochemical system to the probe signal chosen from at least one time feature $ct_i$ and/or at least one frequency feature $cf_i$; and a characterisation phase of the state of the electrochemical system comprising:
   a step of transmitting the probe signal in the electrochemical system in such a way as to induce a response in the electrochemical system;
   a step of recording the response of the electrochemical system to the probe signal, the recording concerning the chosen features of the response; and
   a step of determining the operating parameter or parameters $wp_i$ from features of the response recorded during the step of recording the response and from correlations determined during the learning phase.

5. The method according to claim 4, wherein the correlations established during the learning phase concern at least one first operating parameter $wp_i$ and a second operating parameter, referred to as test parameter $wp_{test}$, said parameters having been taken into account during the determining of the probe signal, and wherein the characterisation phase comprises:
   a step of measuring the test parameter $wp_{test}$, said step of measuring being concurrent with the step of transmitting the probe signal of the characterisation phase;
   after the step of determining the operating parameter or parameters $wp_i$, a step of evaluating the precision of the determining according to the measured value of the test parameter $wp_{test}$ and the value determined using correlations of this same parameter.

6. The method according to claim 5, wherein, during the characterisation phase, when the precision evaluated during the step of evaluating the precision is below a predetermined threshold, the value of the parameter or parameters determined using correlations is invalidated.

7. The method according to claim 6, wherein, during the characterisation phase, when the value of the operating parameters $wp_1$ is invalidated, the value of these operating parameters $wp_1$ is then determined according to the last known value of said parameters.

8. The method according to claim 6, wherein the steps of the characterisation phase are repeated at regular intervals and wherein, when during a number of successive iterations greater than or equal to a predetermined threshold, the value of the operating parameter or parameters $wp_1$ determined using correlations is invalidated, the characterisation phase comprises a step of detecting an operating fault of the electrochemical system.

9. The method according to claim 4, wherein the learning phase comprises, for at least one standard electrochemical system and for each operating point $PF_i$ of a plurality of operating points $\{PF_i\}$:
 a step of transmitting the probe signal in such a way as to induce a response in the electrochemical system;
 a step of measuring the operating parameter or parameters $wp_i$ of the standard electrochemical system relative to the operating point $CF_i$, said step of measuring being concurrent with the step of transmitting the probe signal;
 a step of recording the response of the electrochemical system to the probe signal, the recording concerning at least two features of the response chosen from at least one time feature $ct_i$ and/or at least one frequency feature $cf_i$;
 in such a way as to obtain a plurality of recordings of the response; the learning phase further comprising a step of determining correlations between the operating parameter or parameters $wp_i$ measured and the chosen features of the response.

10. The method according to claim 9, wherein, during the step of determining correlations, each operating parameter $wp_i$ is weighted.

11. The method according to claim 9, wherein a plurality of operating parameters $\{wp_i\}$ is measured during the step of measuring the operating parameter or parameters $wp_i$ and wherein, during the step of determining correlations, the determining of correlations for a given operating parameter $wp_i$ takes into account the other operating parameters $wp_j$.

12. A method for managing an electrochemical system implementing a method according to claim 1.

13. A device comprising means configured to implement a method according to claim 1.

14. A computer program comprising instructions that, when the program is executed by a computer, lead the latter to implement the method according to claim 1.

15. A non-transitory computer-readable storage medium on which is recorded the computer program comprising machine executable instruction for carrying out a method according to claim 1.

* * * * *